United States Patent
Tabei et al.

(10) Patent No.: US 7,452,571 B2
(45) Date of Patent: Nov. 18, 2008

(54) METHOD OF SEALING SEMICONDUCTOR ELEMENT MOUNTED ON GOLD-PLATED PRINTED CIRCUIT BOARD

(75) Inventors: Eiichi Tabei, Annaka (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 98 days.

(21) Appl. No.: 11/557,249

(22) Filed: Nov. 7, 2006

(65) Prior Publication Data
US 2007/0104872 A1    May 10, 2007

(30) Foreign Application Priority Data
Nov. 8, 2005    (JP) .............................. 2005-323241

(51) Int. Cl.
*B05D 3/10*    (2006.01)
*C08G 77/12*    (2006.01)
*C08G 77/20*    (2006.01)
*C08G 77/04*    (2006.01)
*C08G 77/00*    (2006.01)

(52) U.S. Cl. ........................... 427/301; 528/31; 528/32; 528/33; 528/37; 528/40; 528/41

(58) Field of Classification Search ................. 427/301; 528/41
See application file for complete search history.

(56) References Cited

U.S. PATENT DOCUMENTS

| 4,763,407 | A  | * | 8/1988 | Abe ............................ 29/840 |
| 6,348,267 | B1 | * | 2/2002 | Okajima .................. 428/423.7 |
| 7,323,250 | B2 | * | 1/2008 | Tabei et al. ................. 428/447 |
| 2005/0171318 | A1 | * | 8/2005 | Okuhira et al. ............... 528/34 |
| 2007/0104872 | A1 |   | 5/2007 | Tabei et al. |

OTHER PUBLICATIONS

U.S. Appl. No. 11/853,448, filed Sep. 11, 2007, Tabei.
"Electronic Materials", vol. 44, No. 9, Sep. 2005, (published by K.K. Kogyo Chosakai Publishing, Inc.), pp. 90 to 93, 112, cover sheet and translation of relevant part of p. 91, left col., lines 1-8.

* cited by examiner

*Primary Examiner*—Randy Gulakowski
*Assistant Examiner*—Robert Loewe
(74) *Attorney, Agent, or Firm*—Oblon, Spivak, McClelland, Maier & Neustadt, P.C.

(57) ABSTRACT

Methods of sealing a semiconductor element are provided. The methods includes the steps of coating a semiconductor element mounted on a gold-plated printed circuit board with a curable silicone resin, and then curing the curable silicone resin. In a method, the gold-plated printed circuit board is subjected to preliminary treatment with a treatment agent including an acid anhydride group-containing alkoxysilane and/or a partial hydrolysis-condensation product thereof In another method, the curable silicone resin includes the treatment agent. The methods yield favorable adhesion upon sealing.

24 Claims, No Drawings

METHOD OF SEALING SEMICONDUCTOR ELEMENT MOUNTED ON GOLD-PLATED PRINTED CIRCUIT BOARD

CROSS REFERENCES TO RELATED APPLICATIONS

This application claims priority to Japanese Patent Application No. 2005-323241, filed on Nov. 8, 2005.

BACKGROUND OF THE INVENTION

1. Field of the Invention

The present invention relates to a method of sealing a semiconductor element that is mounted on a gold-plated printed circuit board.

2. Description of the Prior Art

Examples of conventional optical semiconductors include light-receiving elements such as the photodiodes of various optical sensors and phototransistors, as well as light-emitting diodes (LED). One known method of molding such optical semiconductors involves, for example, mounting the semiconductor element on a gold-plated printed circuit board, and following wire-bonding, sealing the semiconductor element using a molding technique such as potting or transfer molding.

Epoxy resins have conventionally been used as the sealing materials, but improvements in the performance levels of elements, and the resulting increases in optical energy and heat generated by the elements, have lead to discoloration and degradation of the epoxy resins becoming a significant issue (see non-patent reference 1). Silicone resins are possible alternative resins that offer excellent durability, but because silicone resins exhibit poor adhesion when employed within the method described above, simple replacement of epoxy resins with silicone resins is problematic (see non-patent reference 2).

[Non-patent Reference 1]
Electronic Materials, September Issue (No. 44(9)), pp. 86 to 89 (published by Kogyo Chosakai Publishing, Inc.)

[Non-patent Reference 2]
Electronic Materials, September Issue (No. 44(9)), pp. 90 to 93 (published by Kogyo Chosakai Publishing, Inc.)

On the other hand, known methods of bonding together inorganic substances and silicone materials include methods in which the inorganic substance is first subjected to preliminary surface treatment with a silane coupling agent, and methods in which a silane coupling agent is added to the silicone material. Specific examples include methods in which a silane coupling agent is sprayed onto the inorganic substance, either as a neat liquid or in the form of a solution that has been diluted with a solvent (either an organic solvent or water), and methods in which the inorganic substance is immersed in the silane coupling agent and then dried. However, when the inorganic substance is gold (such as gold plating), achieving a favorable degree of adhesion has proven difficult.

SUMMARY OF THE INVENTION

In order to address the problems described above, an object of the present invention is to provide a method of sealing a semiconductor element that yields favorable adhesion upon sealing a gold-plated printed circuit board with a semiconductor element mounted thereon with a silicone resin.

As a result of intensive investigation aimed at achieving the above object, the inventors of the present invention were able to complete the present invention.

In other words, a first aspect of the present invention provides a method of sealing a semiconductor element (hereafter referred to as "the sealing method 1"), comprising the steps of coating a semiconductor element mounted on a gold-plated printed circuit board with a curable silicone resin, and then curing the curable silicone resin, wherein the gold-plated printed circuit board is subjected to preliminary treatment with a treatment agent comprising an acid anhydride group-containing alkoxysilane or a partial hydrolysis-condensation product thereof, or a combination thereof.

A second aspect of the present invention provides a method of sealing a semiconductor element (hereafter referred to as "the sealing method 2"), comprising the steps of coating a semiconductor element mounted on a gold-plated printed circuit board with a curable silicone resin, and then curing the curable silicone resin, wherein the curable silicone resin comprises a treatment agent comprising an acid anhydride group-containing alkoxysilane or a partial hydrolysis-condensation product thereof, or a combination thereof.

By employing a sealing method of the present invention, the resulting sealed product (laminate) exhibits particularly superior adhesion between the gold-plated printed circuit board and the silicone resin, while the silicone resin exhibits favorable external appearance and hardness, and no noticeable tackiness. In addition, the silicone resin also exhibits favorable durability under heat cycling, conditions of high temperature and high humidity, and reflow conditions. Accordingly, a sealing method of the present invention is particularly ideal as a method of sealing semiconductor elements (for example, optical semiconductor elements such as photodiodes, phototransistors, and light-receiving elements) for applications that require protection, sealing, or adhesion of light-receiving elements or light emitting diodes.

DETAILED DESCRIPTION OF THE PREFERRED EMBODIMENTS

As follows is a more detailed description of the present invention.

<Treatment Agent>

The treatment agent used in a sealing method of the present invention is an acid anhydride group-containing alkoxysilane or a partial hydrolysis-condensation product thereof, or a combination of the two, and more specifically, is a compound that contains an acid anhydride group and an alkoxy group within a single molecule. The acid anhydride group-containing alkoxysilane can be represented, for example, by a general formula (1) shown below.

$$R_{(4-n)}SiX_n \qquad (1)$$

(wherein, R represents an acid anhydride group, and X represents an alkoxy group or monovalent hydrocarbon group of 1 to 6 carbon atoms, provided at least one of the X groups is an alkoxy group, and n is an integer from 1 to 3)

In the above general formula (1), examples of the acid anhydride group represented by R include groups represented by the structural formulas shown below.

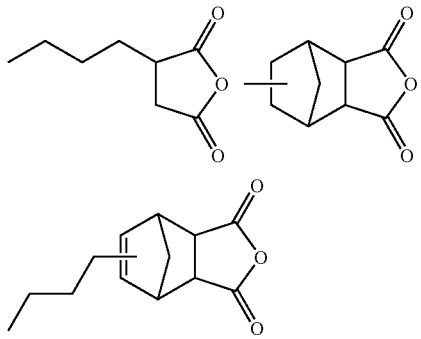

In the above general formula (1), the alkoxy group represented by X is preferably a group of 1 to 4 carbon atoms, and specific examples of suitable groups include a methoxy group, ethoxy group, or propoxy group, although a methoxy group is preferred. The monovalent hydrocarbon group represented by X is preferably a group of 1 to 4 carbon atoms, and specific examples of suitable groups include alkyl groups such as a methyl group, ethyl group, propyl group, butyl group, pentyl group, or hexyl group, although a methyl group is preferred in terms of industrial availability. In the above general formula (1), compounds in which from 2 to 3, and preferably 3, of the X groups are alkoxy groups are preferred, as such compounds offer improved adhesion to inorganic substances.

Specific examples of the acid anhydride group-containing alkoxysilanes represented by the above general formula (1) include the addition reaction product of allylsuccinic anhydride and trimethoxysilane, represented by a structural formula (1a) shown below:

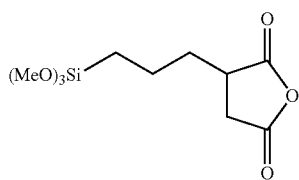

(wherein, Me represents a methyl group, and this abbreviation also applies below); the addition reaction product of allylsuccinic anhydride and triethoxysilane, represented by a structural formula (1b) shown below:

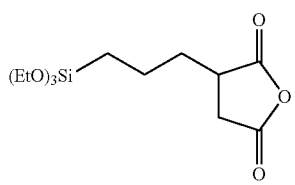

(wherein, Et represents an ethyl group, and this abbreviation also applies below); the addition reaction product of 5-norbornene-2,3-dicarboxylic anhydride and trimethoxysilane, represented by a structural formula (1c) shown below:

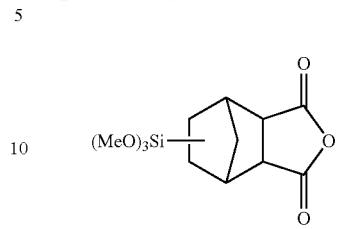

and the addition reaction product of allylnadic anhydride and trimethoxysilane, represented by a structural formula (1d) shown below.

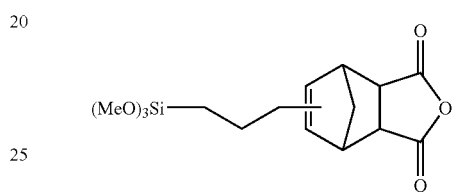

Of the various treatment agents that can be used in a sealing method of the present invention, a partial hydrolysis-condensation product of an acid anhydride group-containing alkoxysilane refers to a compound obtained by subjecting an aforementioned acid anhydride group-containing alkoxysilane to partial hydrolysis and condensation.

These treatment agents may be used either alone, or in combinations of two or more different compounds.

<Curable Silicone Resin>

The curable silicone resin used in a sealing method of the present invention is typically a curable silicone resin composition, and is preferably a composition comprising the components (A) through (C) listed below. As follows is a description of one example of a composition that represents a preferred embodiment.

[(A) Organosilicon Compound containing Addition Reactive Carbon-Carbon Double Bonds]

The component (A) is an organosilicon compound that contains two or more, and preferably from 2 to 10, addition reactive carbon-carbon double bonds within each molecule. The expression "addition reactive" refers to the ability of a group to undergo an addition reaction with a hydrogen atom bonded to a silicon atom via a hydrosilylation reaction.

Examples of addition reactive carbon-carbon double bonds include alkenyl groups such as a vinyl group or allyl group; and carbon-carbon double bonds such as a vinylene group (—CH═CH—) that are incorporated within an alicyclic hydrocarbon ring.

The structure of the component (A) may be a straight chain structure, a cyclic structure, or a structure that includes partial chain branching.

There are no particular restrictions on the component (A), and typical examples include the types of alkenyl group-containing organopolysiloxanes or disilylphenylene group-containing organosilicon compounds typically used as the primary component within conventional addition reaction-curable silicone resin compositions used in the field of semiconductor element sealing. A disilylphenylene group refers to a group represented by a formula: —SiR$^1_2$—C$_6$H$_4$—SiR$^1_2$—

(wherein, each $R^1$ represents, independently, a monovalent hydrocarbon group. This definition also applies below.)

In the above formula, the monovalent hydrocarbon groups represented by $R^1$ are preferably groups that contain from 1 to 12, and even more preferably from 1 to 6, carbon atoms. Examples of suitable monovalent hydrocarbon groups include a methyl group, ethyl group, propyl group, or butyl group.

-Alkenyl Group-Containing Organopolysiloxane-

An alkenyl group-containing organopolysiloxane is represented, for example, by an average composition formula (2) shown below:

(2)

(wherein, each $R^2$ represents, independently, a substituted or unsubstituted monovalent hydrocarbon group other than a phenyl group, an alkoxy group, or a hydroxyl group, provided that from 0.1 to 80 mol %, and preferably from 0.3 to 70 mol %, of all the $R^2$ groups are alkenyl groups, a represents a number from 0.1 to 1.8, and preferably from 0.2 to 1.6, and b represents a number from 0.2 to 1.9, and preferably from 0.25 to 1.7, provided that $1 \leq a+b<2$, and preferably $1.1 \leq a+b \leq 1.9$, and $0.20 \leq b/(a+b) \leq 0.95$, and preferably $0.3 \leq b/(a+b) \leq 0.85$). Using a compound represented by this average composition formula (2) yields a cured product with excellent light transmittance, and is consequently preferred.

In the above average composition formula (2), the monovalent hydrocarbon groups and alkoxy groups represented by $R^2$ are preferably groups of 1 to 12, and even more preferably 1 to 6, carbon atoms. Examples of suitable monovalent hydrocarbon groups include alkyl groups such as a methyl group, ethyl group, propyl group, or butyl group. Examples of suitable alkoxy groups include a methoxy group, ethoxy group, or propoxy group. From the viewpoints of industrial availability and reactivity, a methoxy group or ethoxy group is preferred as the group $R^2$.

Specific examples of the alkenyl group-containing organopolysiloxanes represented by the above average composition formula (2) include the compounds below.

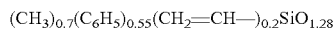

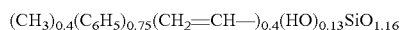

-Disilylphenylene Group-Containing Organosilicon Compound-

Specific examples of suitable disilylphenylene group-containing organosilicon compounds include the compounds represented by a structural formula (3a) shown below.

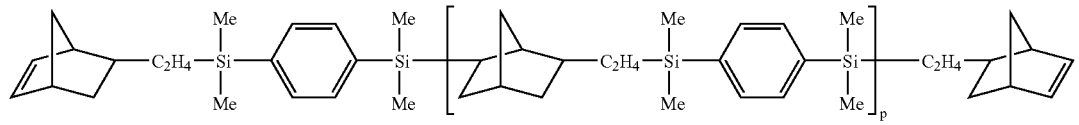

(wherein, p represents an integer from 0 to 10)

A compound of the above structural formula (3a) in which the (average) value of p within the formula is from 0 to 5 is particularly preferred as the component (A).

The component (A) may use either a single compound, or a combination of two or more different compounds.

[(B) Organosilicon Compound Containing Hydrogen Atoms Bonded to Silicon Atoms]

The component (B) is an organosilicon compound that contains two or more, and preferably from 3 to 50, hydrogen atoms bonded to silicon atoms within each molecule. These hydrogen atoms bonded to silicon atoms undergo addition, via a hydrosilylation reaction, with the addition reactive carbon-carbon double bonds within the component (A).

The structure of the component (B) may be a straight chain structure, a cyclic structure, a combination of the two, or a structure that includes partial branching. particular restrictions on the component (B), and typical examples include straight-chain or cyclic organohydrogenpolysiloxanes, and addition reaction products generated by a hydrosilylation reaction between a cyclic organohydrogenpolysiloxane and vinylnorbornene.

A straight-chain organohydrogenpolysiloxane is represented, for example, by a general formula (4) shown below:

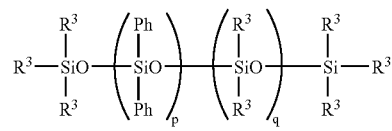

(wherein, each $R^3$ represents, independently, a hydrogen atom or an alkyl group, provided each molecule contains at least two, and preferably three or more, hydrogen atoms, p represents an integer of 0 or greater, and preferably from 1 to 100, and q represents an integer of 0 or greater, and preferably from 1 to 100). Organohydrogenpolysiloxanes in which both p and q are 1 or greater, and in which the molecule contains diphenylsiloxane units and methylhydrogensiloxane units, are particularly preferred.

In the above general formula (4), the alkyl groups represented by $R^3$ are typically groups of 1 to 6 carbon atoms, and suitable examples include a methyl group, ethyl group, or propyl group.

Specific examples of suitable straight-chain organohydrogenpolysiloxanes include the compounds represented by the structural formulas shown below.

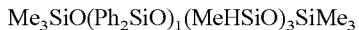
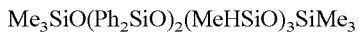
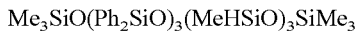

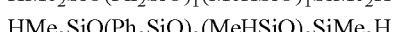
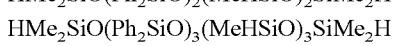

A cyclic organohydrogenpolysiloxane is represented, for example, by a general formula (5) shown below:

(5)

(wherein, each $R^4$ represents, independently, an alkyl group, r represents an integer of 1 or greater, and preferably from 2 to 4, and s represents an integer of 0 or greater, and preferably from 0 to 1)

In the above general formula (5), the alkyl groups represented by $R^4$ are of the same type as the alkyl groups represented by $R^3$ described above.

Specific examples of suitable cyclic organohydrogenpolysiloxanes include the compounds represented by the structural formulas shown below.

(HMeSiO)$_3$ (HMeSiO)$_4$ (HMeSiO)$_3$(Me$_2$SiO)

(HMeSiO)$_4$(Me$_2$SiO)

An addition reaction product is generated, for example, by the hydrosilylation reaction of an aforementioned cyclic organohydrogenpolysiloxane and vinylnorbornene. A specific example of such addition reaction products is the compound represented by a structural formula (6) shown below.

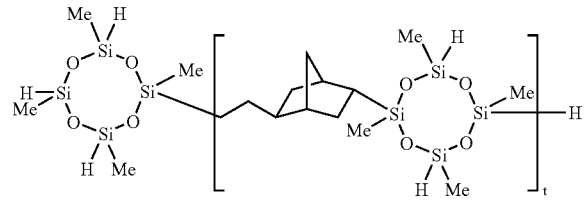

(wherein, t represents an integer from 1 to 50)

The blend quantity of the component (B) is typically within a range from 0.3 to 3.0 mols per 1 mol of addition reactive carbon-carbon double bonds within the component (A), although in order to obtain a cured product with the necessary hardness required for use as a sealing material, this blend quantity is preferably within a range from 0.5 to 2.0 mols, and even more preferably from 0.6 to 1.5 mols.

The component (B) may use either a single compound, or a combination of two or more different compounds.

[(C) Hydrosilylation Reaction Catalyst]

The component (C) is a hydrosilylation reaction catalyst. Any of the conventional hydrosilylation reaction catalysts can be used as the component (C). Specific examples of the component (C) include platinum-based catalysts such as platinum black, platinic chloride, chloroplatinic acid, reaction products of chloroplatinic acid and monovalent alcohols, complexes of chloroplatinic acid and olefins, and bis(acetylacetonato)platinum: Pt{—OC(CH$_3$)=CHC(O)CH$_3$}$_2$; and other platinum group metal-based catalysts such as palladium-based catalysts and rhodium-based catalysts.

There are no particular restrictions on the blend quantity of the component (C), which need only be sufficient to provide an effective catalytic action, although a typical quantity, expressed as a mass-referenced quantity of platinum group metal atoms relative to the combined mass of the component (A) and the component (B), is within a range from 1 to 500 ppm, and blend quantities from approximately 2 to 100 ppm are particularly desirable. Provided the blend quantity satisfies this range, the time required for the curing reaction is of an appropriate length.

[Treatment Agent]

In those cases where the sealing method 2 (which is described in detail below) is applied, the above treatment agent must be blended into the composition. Furthermore, even in those cases where the sealing method 1 (which is described in detail below) is applied, the above treatment agent may still be blended into the composition. The nature of the treatment agent is as described above. The blend quantity of the treatment agent is typically within a range from 1 to 10% by mass of the composition, and is preferably from 2 to 8% by mass, and even more preferably from 2 to 5% by mass. Provided this range is satisfied, favorable adhesion can be achieved without impairing the transparency. The treatment agent may use either a single compound, or a combination of two or more different compounds.

[Other Components]

Other components may also be added to a curable silicone resin composition that can be used favorably within a sealing method of the present invention, provided such addition does not impair the effects of the present invention.

For example, organosilicon compounds that contain only a single hydrogen atom bonded to a silicon atom or a single addition reactive carbon-carbon double bond within each molecule can be added to regulate factors such as the viscosity of the composition or the hardness of the cured product. Specific examples of such compounds include straight-chain diorganopolysiloxanes, three dimensional network-type organopolysiloxanes, cyclic diorganopolysiloxanes, and silphenylene-based compounds which contain only a single hydrogen atom bonded to a silicon atom or a single addition reactive carbon-carbon double bond within each molecule.

In order to ensure satisfactory pot life, an addition reaction retarder such as 1-ethynylcyclohexanol or 3,5-dimethyl-1-hexyn-3-ol may also be added.

Inorganic fillers such as fumed silica may also be added to improve the strength, provided the quantity added has no effect on the transparency. Furthermore, silane coupling agents, dyes, pigments, and flame retardants and the like may also be added.

In order to improve the durability, antioxidants, or photo-stabilizers including hindered amines such as bis(1-octyloxy-2,2,6,6-tetramethyl-4-piperidyl)sebacate can be used.

[Preparation and Curing Conditions]

A curable silicone resin composition that can be used favorably within a sealing method of the present invention can be prepared by uniformly mixing together the aforementioned components (A) through (C), together with any other optional components that are added as required. The curing conditions employed for producing a cured product from this composition vary depending on the quantity of the composition, but typically involve heating at 60 to 180° C. for a period of 5 to 600 minutes.

<Method of Sealing Semiconductor Element>

Methods of sealing a semiconductor element mounted on a gold-plated printed circuit board include the two methods described below. As follows is a detailed description of these two methods.

-Sealing Method 1-

The first method is a method of sealing a semiconductor element comprising the steps of coating a semiconductor element mounted on a gold-plated printed circuit board with a curable silicone resin, and then curing the curable silicone resin, wherein the gold-plated printed circuit board is subjected to preliminary treatment with an aforementioned treatment agent.

The method used for treating the gold-plated printed circuit board with the treatment agent may employ either a method in which the gold-plated printed circuit board is treated with the treatment agent prior to mounting of the semiconductor element on the circuit board, or a method in which the gold-plated printed circuit board is treated with the treatment agent following mounting of the semiconductor element on the circuit board. Moreover, in the latter method, either care may be taken to ensure that the semiconductor element mounted on the circuit board is not treated with the treatment agent, or the entire circuit board including the mounted semiconductor element may be treated with the treatment agent.

The treatment agent used in the above sealing method is as described above. The method of conducting the treatment with the treatment agent may involve, for example, applying the treatment agent directly to the circuit board or immersing the circuit board in the treatment agent, but a solution may also be prepared by dissolving the treatment agent in an alcohol such as methanol or ethanol, and if necessary adding an acid such as hydrochloric acid or acetic acid, and this solution then used for the application or immersion. In those cases where a solution is prepared and then used for either application or immersion, the alcohol within the solution must be removed to dry the surface of the circuit board surface following the treatment and prior to coating with the curable silicone resin. The quantity of the treatment agent used in this treatment need only be sufficient to ensure favorable adhesion between the curable silicone resin and the gold-plated printed circuit board.

Although there are no particular restrictions on the curable silicone resin used in the above sealing method, the use of a curable silicone resin composition described above in the section relating to curable silicone resins is preferred. The semiconductor element can be sealed by conducting potting or the like using this curable silicone resin, thereby coating a portion of, or all of, the gold-plated printed circuit board together with the mounted semiconductor element, and then curing the resin. The quantity used of the curable silicone resin need only be sufficient to cover the semiconductor element. Furthermore, the curing method employed varies depending on the properties of the curable silicone resin, but typically involves heating at 70 to 150° C. for a period of 1 to 10 hours.

One example of the above treatment method 1 is described below. Namely, from 0.01 to 10 parts by mass of a treatment agent comprising an acid anhydride group-containing alkoxysilane or a partial hydrolysis-condensation product thereof, or a combination thereof, is added to 100 parts by mass of an alcohol such as methanol or ethanol, and mixed to generate a uniform solution. Hydrochloric acid or acetic acid may also be added during this process. A gold-plated printed circuit board with a semiconductor element mounted thereon is immersed in the prepared solution for a period of between several seconds and several minutes, and drying is then conducted to remove the alcohol. Following drying, the semiconductor element and the gold-plated printed circuit board are coated with the curable silicone resin composition, and heating is then conducted to complete the sealing process.

-Sealing Method 2-

The second method is a method of sealing a semiconductor element comprising the steps of coating a semiconductor element mounted on a gold-plated printed circuit board with a curable silicone resin, and then curing the curable silicone resin, wherein the curable silicone resin comprises an aforementioned treatment agent.

The curable silicone resin used in the above sealing method is as described above, and the quantity of treatment agent incorporated within the resin is also as described above. The use of a curable silicone resin composition described above in the section relating to curable silicone resins is preferred. The semiconductor element can be sealed by conducting potting or the like using this curable silicone resin, thereby coating a portion of, or all of, the gold-plated printed circuit board together with the mounted semiconductor element, and then curing the resin. The quantity used of the curable silicone resin need only be sufficient to cover the semiconductor element. Furthermore, the curing method employed varies depending on the properties of the curable silicone resin, but typically involves heating at 70 to 150° C. for a period of 1 to 10 hours.

One example of the above treatment method 2 is described below. Namely, from 0.1 to 20 parts by mass of a treatment agent comprising an acid anhydride group-containing alkoxysilane or a partial hydrolysis-condensation product thereof, or a combination thereof, is added to 100 parts by mass of a heat-curable silicone resin composition that contains no treatment agent, and is mixed to generate a uniform resin. The semiconductor element and the gold-plated printed circuit board are then coated with the thus obtained treatment agent-containing composition, and heating is then conducted to complete the sealing process.

EXAMPLES

As follows is a description of specifics of the present invention based on a series of examples and comparative examples, although the present invention is in no way limited by the following examples.

Example 1

A gold-plated printed circuit board with a semiconductor element mounted thereon was immersed for 5 seconds in a solution comprising 0.5 parts by mass of an acid anhydride group-containing alkoxysilane represented by a structural formula (7) shown below:

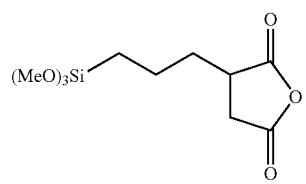

and 99.5 parts by mass of ethanol, and the circuit board was then dried in an oven at 100° C. for 10 minutes. This circuit board was then subjected to potting with a composition A comprising 60 parts by mass of a compound represented by a structural formula (8) shown below:

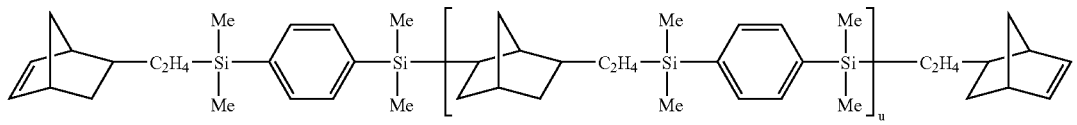

(wherein, u=0.5), 40 parts by mass of a compound represented by a structural formula (9) shown below:

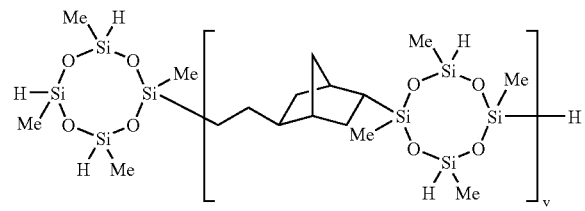

(wherein, v=5), a sufficient quantity of an isopropanol solution of chloroplatinic acid to provide a mass-referenced quantity of platinum metal atoms of 40 ppm relative to the combined mass of the compounds represented by the above structural formulas (8) and (9), and a sufficient quantity of bis(1-octyloxy-2,2,6,6-tetramethyl-4-piperidyl)sebacate to provide a mass-referenced quantity of 100 ppm relative to the combined mass of the compounds represented by the above structural formulas (8) and (9) as a hindered amine-based photostabilizer, thereby forming a coating film with a thickness of approximately 0.1 mm, and this film was then cured by heating at 100° C. for 1 hour, and then at 150° C. for 5 hours. This completed the preparation of a sealed structure.

Example 2

A composition B was prepared by adding 2 parts by mass of the acid anhydride group-containing alkoxysilane represented by the above structural formula (7) to 100 parts by mass of the composition A disclosed in the example 1. This composition B was used for conducting potting of an untreated gold-plated printed circuit board, thereby forming a coating film with a thickness of approximately 0.1 mm, and this film was then cured by heating at 100° C. for 1 hour, and then at 150° C. for 5 hours. This completed the preparation of a sealed structure.

Comparative Example 1

With the exception of replacing the acid anhydride group-containing alkoxysilane in the example 1 with 2-(3,4-epoxycyclohexyl)ethyltrimethoxysilane, a sealed structure was prepared in the same manner as the example 1.

Comparative Example 2

With the exception of replacing the acid anhydride group-containing alkoxysilane in the example 1 with N-(2-aminoethyl)-3-aminopropyltrimethoxysilane, a sealed structure was prepared in the same manner as the example 1.

Comparative Example 3

With the exception of replacing the acid anhydride group-containing alkoxysilane in the example 1 with 3-mercaptopropyltrimethylsilane, a sealed structure was prepared in the same manner as the example 1.

Comparative Example 4

With the exception of not conducting the surface treatment of the circuit board with the acid anhydride group-containing alkoxysilane, a sealed structure was prepared in the same manner as the example 1.

<Evaluation of Properties 2>

The properties of the silicone resin cured products within the sealed structures prepared in the above examples and comparative examples were evaluated in accordance with the methods described below. The results are shown in Table 1.

-External Appearance-

The external appearance of each cured product was evaluated visually. Cured products that exhibited favorable transparency and had a smooth surface were evaluated as "good", whereas cured products which suffered from inferior transparency or surface distortion were evaluated as "poor".

-Tackiness-

The existence of tackiness on each cured product was evaluated by touch.

-Hardness-

The hardness (Shore D) of each cured product was measured.

-Adhesion Test-

Using a cutter, cross-cuts were made in the resin cured product of each sealed structure (namely, the resin on top of the gold-plated printed circuit board) with a spacing of 1 mm between cuts. The degree of resin peeling during this process was observed.

A: Peeling did not occur, even when the circuit board was bent following insertion of the cross-cuts.

B: Peeling did not occur during insertion of the cross-cuts.

C: Peeling occurred during insertion of the crosswise cuts (namely, during insertion of cuts in the second direction).

D: Peeling occurred during insertion of cuts in the first direction. [Table 1]

TABLE 1

| | External appearance | Tackiness | Hardness (Shore D) | Adhesion |
|---|---|---|---|---|
| Example 1 | Good | No | 77 | A |
| Example 2 | Good | No | 77 | A |
| Comparative example 1 | Good | No | 77 | C |
| Comparative example 2 | Good | Yes | 40 | C |
| Comparative example 3 | Good | No | 65 | C |
| Comparative example 4 | Good | No | 77 | D |

What is claimed is:

1. A method of sealing a semiconductor element, comprising:
coating a semiconductor element mounted on a gold-plated printed circuit board with a curable silicone resin; and
then curing said curable silicone resin,
wherein
said gold-plated printed circuit board is subjected to preliminary treatment with a treatment agent comprising an acid anhydride group-containing alkoxysilane or a partial hydrolysis-condensation product thereof, or a combination thereof.

2. The method according to claim 1, wherein said acid anhydride group-containing alkoxysilane is represented by a general formula (1):

$$R_{(4-n)}SiX_n \quad (1)$$

wherein R represents an acid anhydride group, and X represents an alkoxy group or monovalent hydrocarbon group of 1 to 6 carbon atoms, provided at least one of the X groups is an alkoxy group, and n is an integer from 1 to 3.

3. The method according to claim 2, wherein R in formula (1) is represented by any one of the formulas shown below:

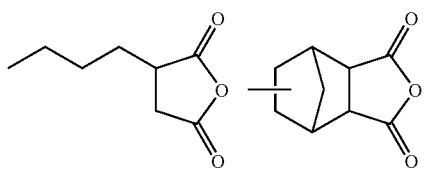

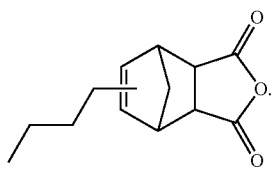

4. The method according to claim 2, wherein X is an alkoxy group of 1 to 4 carbon atoms, or a monovalent hydrocarbon group of 1 to 4 carbon atoms.

5. The method according to claim 1, wherein said acid anhydride group-containing alkoxysilane is an addition reaction product of allylsuccinic anhydride and trimethoxysilane, represented by formula (1a) shown below:

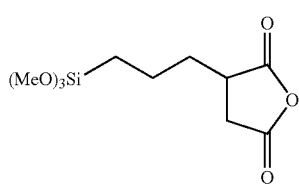

wherein, Me represents a methyl group;

an addition reaction product of allylsuccinic anhydride and triethoxysilane, represented by formula (1b) shown below:

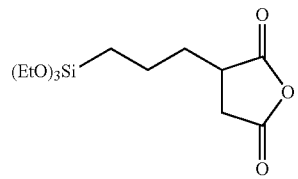

wherein, Et represents an ethyl group;

an addition reaction product of 5-norbornene-2,3-dicarboxylic anhydride and trimethoxysilane, represented by formula (1c) shown below:

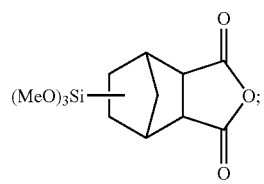

an addition reaction product of allylnadic anhydride and trimethoxysilane, represented by formula (1d) shown below:

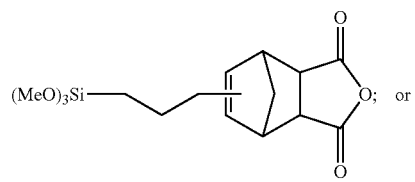 or a mixture of two or more thereof.

6. The method according to claim 1, wherein said curable silicone resin comprises:
(A) an organosilicon compound containing two or more addition reactive carbon-carbon double bonds within each molecule,
(B) an organosilicon compound containing two or more hydrogen atoms bonded to silicon atoms within each molecule, and
(C) a hydrosilylation reaction catalyst.

7. The method according to claim 1, wherein said organosilicon compound containing two or more addition reactive carbon-carbon double bonds within each molecule is an alkenyl group-containing organopolysiloxane represented by an average composition of formula (2):

$$R^2_a(C_6H_5)_bSiO_{[(4-a-b)/2]} \quad (2)$$

wherein, each $R^2$ represents, independently, a substituted or unsubstituted monovalent hydrocarbon group other than a phenyl group, an alkoxy group, or a hydroxyl group, provided that from 0.1 to 80 mol%, and preferably from 0.3 to 70 mol%, of all the $R^2$ groups are alkenyl groups, a represents a number from 0.1 to 1.8, and b represents a number from 0.2 to 1.9, provided that $1 \leq a+b < 2$, and $0.20 \leq b/(a+b) \leq 0.95$.

8. The method according to claim 1, wherein said organosilicon compound containing two or more addition reactive carbon-carbon double bonds within each molecule has an average composition of:

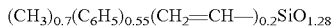

or

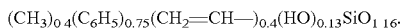

9. The method according to claim 1, wherein said organosilicon compound containing two or more addition reactive carbon-carbon double bonds within each molecule is a disilylphenylene group-containing organosilicon compound.

10. The method according to claim 1, wherein said organosilicon compound containing two or more addition reactive carbon-carbon double bonds within each molecule is a compound represented by formula (3a):

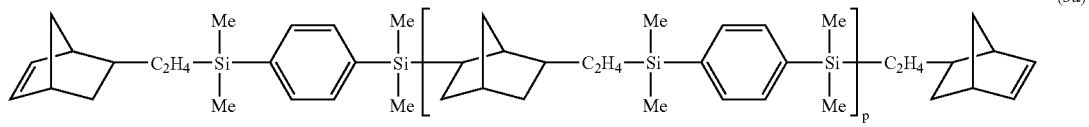

Wherein, p represents an integer from 0 and 10.

11. The method according to claim 1, wherein said organosilicon compound containing two or more hydrogen atoms bonded to silicon atoms within each molecule is a straight-chain organohydrogenpolysiloxane is represented by formula (4):

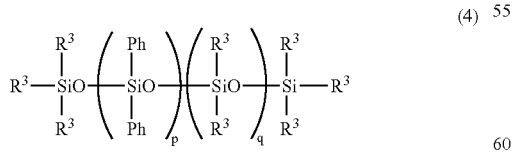

wherein, each $R^3$ represents, independently, a hydrogen atom or an alkyl group, provided each molecule contains at least two, hydrogen atoms, p represents an integer of 0 or greater, and q represents an integer of 0 or greater.

12. The method according to claim 1, wherein said organosilicon compound containing two or more hydrogen atoms bonded to silicon atoms within each molecule is a cyclic organohydrogenpolysiloxane is represented by formula (5):

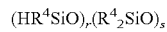

wherein, each $R^4$ represents, independently, an alkyl group, r represents an integer of 1 or greater, and s represents an integer of 0 or greater.

13. The method according to claim 1, wherein said organosilicon compound containing two or more hydrogen atoms bonded to silicon atoms within each molecule is a compound represented by formula (6):

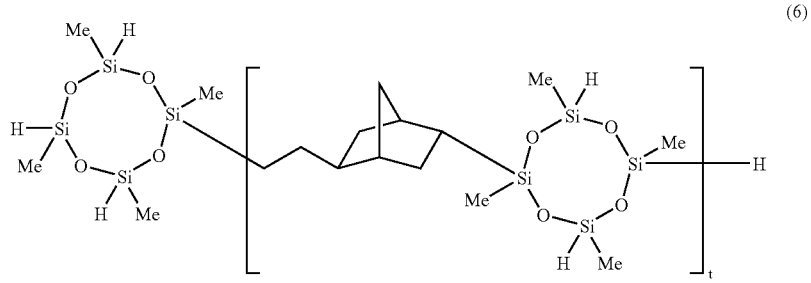

wherein, t represents an integer from 1 to 50.

14. A method of sealing a semiconductor element, comprising:
   coating a semiconductor element mounted on a gold-plated printed circuit board with a curable silicone resin; and
   then curing said curable silicone resin,
   wherein
   said curable silicone resin comprises a treatment agent comprising an acid anhydride group-containing alkoxysilane or a partial hydrolysis-condensation product thereof, or a combination thereof, and
   said curable silicone resin comprises:
   (A) an organosilicon compound containing two or more addition reactive carbon-carbon double bonds within each molecule,
   (B) an organosilicon compound containing two or more hydrogen atoms bonded to silicon atoms within each molecule, and (C) a hydrosilylation reaction catalyst.

15. The method according to claim 14, wherein said acid anhydride group-containing alkoxysilane is represented by formula (1):

$$R_{(4-n)}SiX_n \tag{1}$$

wherein R represents an acid anhydride group, and X represents an alkoxy group or monovalent hydrocarbon group of 1 to 6 carbon atoms, provided at least one of the X groups is an alkoxy group, and n is an integer from 1 to 3.

16. The method according to claim 15, wherein R in formula (1) is represented by any one of the formulas shown below:

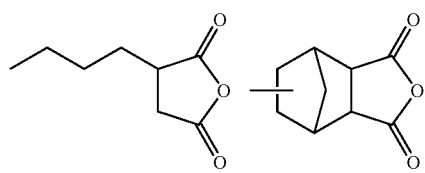

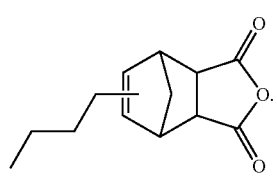

17. The method according to claim 15, wherein X is an alkoxy group of 1 to 4 carbon atoms, or a monovalent hydrocarbon group of 1 to 4 carbon atoms.

18. The method according to claim 14, wherein said acid anhydride group-containing alkoxysilane is an addition reaction product of allylsuccinic anhydride and trimethoxysilane, represented by formula (1a) shown below:

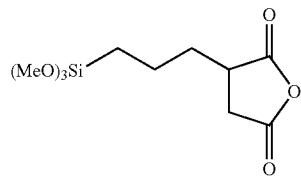

wherein, Me represents a methyl group;

an addition reaction product of allylsuccinic anhydride and triethoxysilane, represented by formula (1b) shown below:

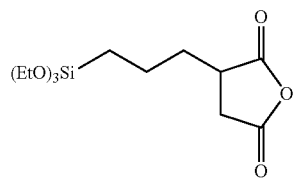

wherein, Et represents an ethyl group;

an addition reaction product of 5-norbornene-2,3-dicarboxylic anhydride and trimethoxysilane, represented by formula (1c) shown below:

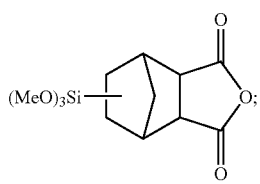

an addition reaction product of allylnadic anhydride and trimethoxysilane, represented by formula (1d) shown below:

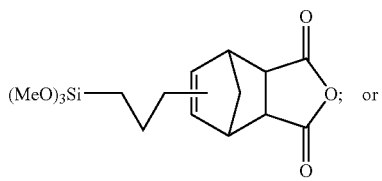

a mixture of two or more thereof.

19. The method according to claim 14, wherein said organosilicon compound containing two or more addition reactive carbon-carbon double bonds within each molecule is an alkenyl group-containing organopolysiloxane represented by an average composition of formula (2):

$$R^2{}_a(C_6H_5)_bSiO_{[(4-a-b)/2]} \tag{2}$$

wherein, each $R^2$ represents, independently, a substituted or unsubstituted monovalent hydrocarbon group other than a phenyl group, an alkoxy group, or a hydroxyl group, provided that from 0.1 to 80 mol%, and preferably from 0.3 to 70 mol%, of all the $R^2$ groups are alkenyl groups, a represents a number from 0.1 to 1.8, and b represents a number from 0.2 to 1.9, provided that $1 \leq a+b < 2$, and $0.20 \leq b/(a+b) \leq 0.95$.

20. The method according to claim 14, wherein said organosilicon compound containing two or more addition reactive carbon-carbon double bonds within each molecule is a disilylphenylene group-containing organosilicon compound.

21. The method according to claim 14, wherein said organosilicon compound containing two or more addition reactive carbon-carbon double bonds within each molecule is a compound represented by formula (3a):

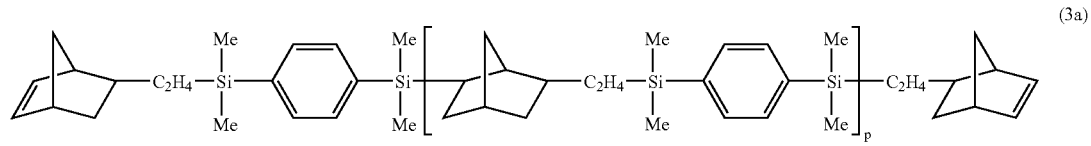

(3a)

wherein, p represents an integer from 0 to 10.

22. The method according to claim 14, wherein said organosilicon compound containing two or more hydrogen atoms bonded to silicon atoms within each molecule is a straight-chain organohydrogenpolysiloxane is represented by formula (4):

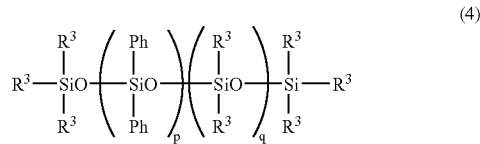

(4)

wherein, each $R^3$ represents, independently, a hydrogen atom or an alkyl group, provided each molecule contains at least two, hydrogen atoms, p represents an integer of 0 or greater, and q represents an integer of 0 or greater.

23. The method according to claim 14, wherein said organosilicon compound containing two or more hydrogen atoms bonded to silicon atoms within each molecule is a cyclic organohydrogenpolysiloxane is represented by formula (5):

$$(HR^4SiO)_r(R^4{}_2SiO)_s \qquad (5)$$

wherein, each $R^4$ represents, independently, an alkyl group, r represents an integer of 1 or greater, and s represents an integer of 0 or greater.

24. The method according to claim 14, wherein said organosilicon compound containing two or more hydrogen atoms bonded to silicon atoms within each molecule is a compound represented by formula (6):

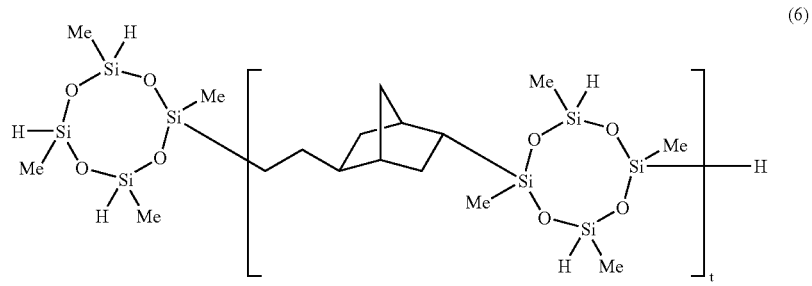

(6)

wherein, t represents an integer from 1 to 50.

\* \* \* \* \*